(12) United States Patent
Park

(10) Patent No.: US 11,229,118 B2
(45) Date of Patent: Jan. 18, 2022

(54) PRINTED CIRCUIT BOARD

(71) Applicant: Samsung Electro-Mechanics Co., Ltd., Suwon-si (KR)

(72) Inventor: Chang-Hwa Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 17 days.

(21) Appl. No.: 16/674,640

(22) Filed: Nov. 5, 2019

(65) Prior Publication Data
US 2020/0154570 A1 May 14, 2020

(30) Foreign Application Priority Data
Nov. 14, 2018 (KR) .................. 10-2018-0139755

(51) Int. Cl.
| | |
|---|---|
| H05K 1/14 | (2006.01) |
| H05K 1/11 | (2006.01) |
| H05K 3/36 | (2006.01) |
| H05K 3/32 | (2006.01) |
| H05K 3/46 | (2006.01) |

(52) U.S. Cl.
CPC ............ *H05K 1/147* (2013.01); *H05K 1/115* (2013.01); *H05K 3/321* (2013.01); *H05K 3/361* (2013.01); *H05K 3/4691* (2013.01); *H05K 2201/0141* (2013.01); *H05K 2201/0154* (2013.01)

(58) Field of Classification Search
CPC ........ H05K 1/147; H05K 1/115; H05K 3/321; H05K 3/361; H05K 3/4691; H05K 2201/0141
USPC ......................................................... 361/749
See application file for complete search history.

(56) References Cited

U.S. PATENT DOCUMENTS

| | | | |
|---|---|---|---|
| 5,175,047 A * | 12/1992 | McKenney | H05K 3/4691 174/250 |
| 2004/0118595 A1* | 6/2004 | Flammer | H05K 1/118 174/254 |

FOREIGN PATENT DOCUMENTS

| | | |
|---|---|---|
| JP | 2002-517898 A | 6/2002 |
| KR | 10-0771308 B1 | 10/2007 |
| KR | 10-2013-0018027 A | 2/2013 |

* cited by examiner

*Primary Examiner* — Tremesha S Willis
(74) *Attorney, Agent, or Firm* — NSIP Law

(57) ABSTRACT

A printed circuit board, comprising a flexible insulating layer, a rigid insulating layer laminated on a portion of the flexible insulating layer, and a coverlay disposed on an upper surface of the rigid insulating layer, an upper surface of the flexible insulating layer, and a side surface of the rigid insulating layer positioned between the upper surface of the rigid insulating layer and the upper surface of the flexible insulating layer.

14 Claims, 7 Drawing Sheets

PRINTED CIRCUIT BOARD

CROSS-REFERENCE TO RELATED APPLICATION

This application claims the benefit under 35 USC 119(a) of Korean Patent Application No. 10-2018-0139755, filed on Nov. 14, 2018, in the Korean Intellectual Property Office, the entire disclosure of which is incorporated herein by reference for all purposes.

BACKGROUND

1. Field

The following description relates to a printed circuit board.

2. Description of Related Art

A rigid and flexible printed circuit board (RFPCB) that includes a rigid portion and a flexible portion may be used in a thin and miniaturized mobile device, as a printed circuit board, for efficiently utilizing an internal space of the mobile device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board, comprising a flexible insulating layer, a rigid insulating layer laminated on a portion of the flexible insulating layer, and a coverlay disposed on an upper surface of the rigid insulating layer, an upper surface of the flexible insulating layer, and a side surface of the rigid insulating layer positioned between the upper surface of the rigid insulating layer and the upper surface of the flexible insulating layer.

The coverlay may adhere to the upper surface of the rigid insulating layer, the upper surface of the flexible insulating layer, and the side surface of the rigid insulating layer by an adhesion layer.

The adhesion layer may be bonded to the upper surface of the rigid insulating layer, the upper surface of the flexible insulating layer, and the side surface of the rigid insulating layer positioned between the upper surface of the rigid insulating layer and the upper surface of the flexible insulating layer.

The coverlay may be formed of any one or any combination of any two or more of polyimide (PI), a liquid-crystal polymer (LCP), or Teflon.

A thickness of the adhesion layer may be smaller than a thickness of the coverlay.

The printed circuit board may further include a first circuit formed on the upper surface of the flexible insulating layer and covered by the coverlay, and a second circuit formed on the rigid insulating layer and covered by the coverlay.

A side surface of the second circuit may be exposed to a side surface of the rigid insulating layer and covered by the coverlay.

The printed circuit board may further include a via penetrating through the coverlay and the adhesion layer and electrically connected to the second circuit.

The rigid insulating layer may be formed of a plurality of layers, and the coverlay is bonded to an uppermost layer of the plurality of layers.

In another general aspect, a printed circuit board having a rigid portion and a flexible portion, includes a laminate comprising a flexible insulating layer and a rigid insulating layer; and a coverlay disposed on an outermost surface of the laminate, and an adhesion layer disposed between the laminate and the coverlay. The coverlay may be disposed over the flexible portion and the rigid portion.

The coverlay may be disposed over a side surface of the rigid insulating layer.

The coverlay may be formed of a material containing any one or any combination of any two or more of polyimide (PI), a liquid-crystal polymer (LCP), or Teflon.

A thickness of the adhesion layer may be smaller than a thickness of the coverlay.

A circuit may be formed on the outermost surface of the laminate, and the circuit may be covered by the coverlay.

The printed circuit board may further include a via penetrating through the coverlay and the adhesion layer, and connecting to the circuit.

In another general aspect, a method of manufacturing a printed circuit board, includes forming a flexible insulating layer, laminating a rigid insulating layer on a portion of the flexible insulating layer, and disposing a coverlay on an upper surface of the rigid insulating layer, an upper surface of the flexible insulating layer, and a side surface of the rigid insulating layer positioned between the upper surface of the rigid insulating layer and the upper surface of the flexible insulating layer.

The coverlay may be adhered to the upper surface of the rigid insulating layer, the upper surface of the flexible insulating layer, and the side surface of the rigid insulating layer by an adhesion layer.

The coverlay may be formed of any one or any combination of any two or more of polyimide (PI), a liquid-crystal polymer (LCP), or Teflon.

A thickness of the adhesion layer may be formed smaller than a thickness of the coverlay.

The method may further include forming a first circuit on the upper surface of the flexible insulating layer, disposing the coverlay on the formed first circuit, and forming a second circuit on the rigid insulating layer and disposing the coverlay on the formed second circuit.

Other features and aspects will be apparent from the following detailed description, the drawings, and the claims

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
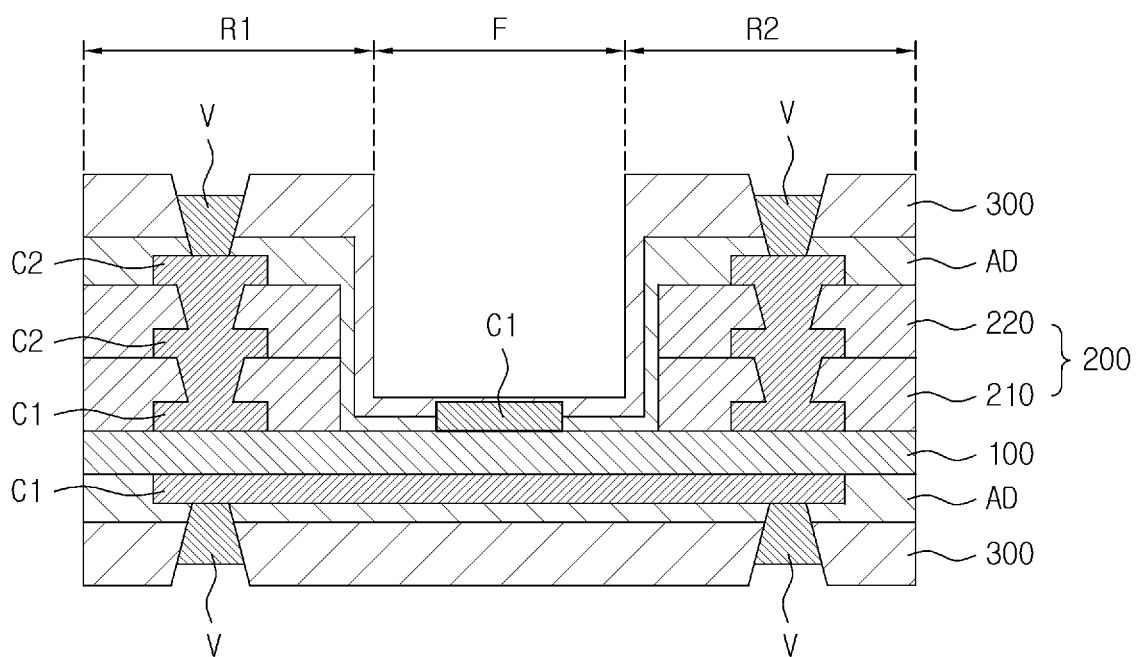
FIG. 1 illustrates an example of a printed circuit board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 illustrates a printed circuit board.

Referring to FIG. 1, a printed circuit board may include a flexible portion F and rigid portions R1 and R2. The flexible portion F and the rigid portions R1 and R2 are integrally formed. Such an integrated rigid and flexible board may be distinguished from a board formed by separately manufacturing a rigid board and a flexible board and then coupling the rigid board and the flexible board to each other by soldering and the like.

The flexible portion F has a relatively high bendability and may be bent when the printed circuit board is mounted in an electronic device. The rigid portions R1 and R2 have a relatively low bendability. The thickness of each of the rigid portions R1 and R2 may be greater than that of the flexible portion F. In addition, the width of each of the rigid portions R1 and R2 may be greater than that of the flexible portion F, and the length of each of the rigid portions R1 and R2 may be shorter than that of the flexible portion F.

The printed circuit board may include a flexible insulating layer 100, a rigid insulating layer 200, a coverlay 300, and an adhesion layer AD.

The flexible insulating layer 100 may be included in the flexible portion F and the rigid portions R1 and R2, and may be an insulating layer formed of a material having flexibility and a relatively high bendability. The flexible insulating layer 100 may be continuously formed on all of the flexible portion F and the rigid portions R1 and R2. The flexible insulating layer 100 may be formed of a resin having a high bendability. Such a resin may include at least one of a polyimide (PI) resin, a liquid-crystal polymer (LCP) resin, or a Teflon resin.

The flexible insulating layer 100 may be formed of a single layer or a plurality of layers.

The rigid insulating layer 200 may be laminated on a portion of a region of the flexible insulating layer 100, and may be an insulating layer formed of a material having a relatively low bendability. The rigid insulating layer 200 may include a resin having a low bendability, and such a resin may include an epoxy resin. In addition, the rigid insulating layer 200 may include a fiber reinforcement material, such as a glass fiber. In an example, the rigid insulating layer 200 may be a prepreg. The rigid insulating layer 200 may include an organic filler or an inorganic filler.

The rigid insulating layer 200 may be laminated on the portion of the region of the flexible insulating layer 100 so that the rigid insulating layer 200 is included in the rigid portions R1 and R2 and is not included in the flexible portion F. That is, the rigid portions R1 and R2 are determined depending on the region where the rigid insulating layer 200 is laminated. A plurality of rigid portions R1 and R2 may be formed. In this example, the flexible portion F may be positioned between the plurality of rigid portions R1 and R2;

however, the example is not limited thereto. In another non-limiting example, a single rigid portion may also be formed. In this case, the flexible portion F extends from the rigid portion.

An asymmetrical printed circuit board may be implemented when the rigid insulating layer 200 is laminated on only one surface of the flexible insulating layer 100. In addition, the rigid insulating layer 200 may be formed of a plurality of layers 210 and 220. Referring to FIG. 1, in the printed circuit board, the rigid insulating layer 200 is formed of two layers 210 and 220, but is not limited thereto.

In an example where the flexible insulating layer 100 and the rigid insulating layer 200 each are formed of a plurality of layers, a plurality of flexible insulating layers 100 and a plurality of rigid insulating layers 200 may be alternately laminated.

A laminate may be formed by laminating the flexible insulating layer 100 and the rigid insulating layer 200 together. That is, a resulting product obtained by laminating the flexible insulating layer 100 and the rigid insulating layer 200 may be referred to as a laminate.

Circuits may be formed on the flexible insulating layer 100 and the rigid insulating layer 200. The circuit is a conductive wire providing a path transmitting an electrical signal and has a pattern according to the path of the electrical signal. The circuit may be formed of a material containing a metal. The metal of the circuit may contain at least one selected from the group consisting of copper (Cu), nickel (Ni), silver (Ag), and palladium (Pd), but is not limited thereto. Any metal may be used in the circuit.

A circuit formed on a surface or both surfaces of the flexible insulating layer 100 may be referred to as a first circuit C1. The first circuit C1 may be included in the rigid portions R1 and R2 and the flexible portion F. Portions of the first circuit C1 positioned in the rigid portions R1 and R2 are covered by the rigid insulating layer 200 and a portion of the first circuit C1 positioned in the flexible portion F is not covered by the rigid insulating layer 200. The first circuit C1 may have a linear conductive wire formed on all of the rigid portions R1 and R2 and the flexible portion F but is not limited thereto. The first circuit C1 may include a plurality of linear conductive wires, and the plurality of linear conductive wires may be arranged in parallel with each other to be spaced apart from each other.

In a case where the first circuits C1 are formed on both surfaces of the flexible insulating layer 100, respectively, a via (inner via) penetrating through the flexible insulating layer 100 and electrically connecting between the first circuits C1 may be formed on the flexible insulating layer 100.

A circuit formed on one surface of the rigid insulating layer 200 may be referred to as a second circuit C2. In a case where the rigid insulating layer 200 is formed of a plurality of layers, the second circuits C2 may be formed on one surface of each of the rigid insulating layers 200. A portion of the second circuit C2 formed on one surface of the outermost layer of the plurality of layers of the rigid insulating layer 200 may function as a pad.

The first circuit C1 and the second circuit C2 may be electrically connected to each other through the inner via IV. The second circuits C2 disposed on different layers of the rigid insulating layer 200 may be electrically connected to each other through the inner via IV.

In addition, end surfaces of at least some of the second circuits C2 may be exposed to an end surface of the rigid insulating layer 200. In particular, end surfaces of at least some of the second circuits C2 may be exposed to an end surface of the rigid insulating layer 200 positioned between an upper surface of the rigid insulating layer 200 and an upper surface of the flexible insulating layer 100.

The coverlay 300 may be a layer bonded to the outermost surface of the laminate and may protect the outermost surface. In an example where a circuit (outermost circuit) is formed on the outermost surface of the laminate, the coverlay 300 may cover and protect the outermost circuit. The coverlay 300 may collectively cover the flexible portion F and the rigid portions R1 and R2.

The coverlay 300 may be bonded to the upper surface of the rigid insulating layer 200, the upper surface of the flexible insulating layer 100, and a side surface of the rigid insulating layer 200. In an example where the rigid insulating layer 200 is formed of the plurality of layers 210 and 220, the coverlay 300 is bonded to the layer 220 positioned on the uppermost layer of the plurality of layers 210 and 220. In addition, the coverlay 300 may be bonded to the side surface of the rigid insulating layer 200 positioned between the upper surface of the rigid insulating layer 200 and the upper surface of the flexible insulating layer 100. Here, the coverlay 300 is continuously and collectively bonded to the upper surface of the rigid insulating layer 200, the upper surface of the flexible insulating layer 100, and the side surface of the rigid insulating layer 200. Accordingly, since an interface between the rigid insulating layer 200 and the flexible insulating layer 100 is covered by the coverlay 300, the introduction of foreign materials into the rigid insulating layer 200 and the flexible insulating layer 100 through the interface may be prevented. In addition, in the case where the rigid insulating layer 200 is formed of the plurality of layers 210 and 220, since an interface between the plurality of layers 210 and 220 of the rigid insulating layer 200 is also covered by the coverlay 300, the introduction of foreign materials into the rigid insulating layer 200 may be prevented by the coverlay 300.

Further, as described above, the end surfaces of the at least some of the second circuits C2 may be exposed to the end surface of the rigid insulating layer 200. In particular, the end surfaces of the at least some of the second circuits C2 may be exposed to the end surface of the rigid insulating layer 200 positioned between the upper surface of the rigid insulating layer 200 and the upper surface of the flexible insulating layer 100. In this example, the exposed side surface of the second circuit C2 may be covered by the adhesion layer AD and the coverlay 300. Accordingly, the side surface of the second circuit C2 may be protected from foreign materials.

In an example, the coverlay 300 may be formed not only on an upper surface of the laminate but also on a lower surface of the laminate. The coverlay 300 may cover a side surface of the laminate, and further may cover the entire outermost surface of the laminate.

The coverlay 300 may be formed of a material containing at least one of polyimide (PI), a liquid-crystal polymer (LCP), or Teflon, and may be formed of the same material as that of the flexible insulating layer 100. In this example, the coverlay 300 may be formed of a material having a high bendability and be the same material as that of the flexible portion F. In an example, the coverlay 300 may be a film type coverlay and may be distinguished from a liquid type coverlay. In particular, a vacuum press lamination described below may be performed on the film type coverlay 300. However, in an example of the liquid type coverlay, applying and curing processes may be required instead of the vacuum press lamination process.

The coverlay 300 may be bonded by the adhesion layer AD. The adhesion layer AD may be formed of a material having a high bendability. The material for the adhesion layer AD may be selected with no limitation as long as it has high enough adhesiveness to be used in a printed circuit board.

The adhesion layer AD may be formed on the entire region of the coverlay 300. That is, the adhesion layer AD may be collectively bonded to the rigid portions R1 and R2 and the flexible portion F. The adhesion layer AD may be collectively bonded to the upper surface of the rigid insulating layer 200, the upper surface of the flexible insulating layer 100, and the side surface of the rigid insulating layer 200. In particular, the adhesion layer AD may be bonded to the side surface of the rigid insulating layer 200 positioned between the upper surface of the rigid insulating layer 200 and the upper surface of the flexible insulating layer 100. The adhesion layer AD may be formed not only on the upper surface of the laminate but also on the lower surface of the laminate. The coverlay 300 may cover even a side surface of the laminate, and further may cover the entire outermost surface of the laminate.

The adhesion layer AD functions to adhere the coverlay 300 while simultaneously covering the interface between the rigid insulating layer 200 and the flexible insulating layer 100, thereby making it possible to prevent the introduction of foreign materials into the interface.

In addition, when the adhesion layer AD and the coverlay 300 are laminated on the rigid insulating layer 200, a solder resist used as a protective layer in the related art may be omitted. Accordingly, in a method for manufacturing a printed circuit board, a process of applying and curing a solder resist may be omitted.

The thickness of the adhesion layer AD may be smaller than that of the coverlay 300, but is not limited thereto. In addition, in FIG. 1, the thicknesses of the adhesion layer AD and the coverlay 300 are illustrated to be small at the side surface of the insulating layer 200, but is also not limited thereto. The thicknesses of the adhesion layer AD and the coverlay 300 may be uniform over the entire region of the laminate.

The printed circuit board may further include a via, outer via V, penetrating through the adhesion layer AD and the coverlay 300. The via, outer via V, may be formed in the rigid portions R1 and R2, and be in contact with and be electrically connected to the second circuit C2. In particular, the outer via V may be in contact with a pad of the second circuit C2.

The outer via V penetrating through the adhesion layer AD and the coverlay 300 may be formed by machining a via hole by a laser machining and then filling the via hole with a conductive material. An upper surface of the outer via V may be exposed through the adhesion layer AD and the coverlay 300.

A horizontal cross-sectional area of the outer via V may be decreased toward the inside of the printed circuit board.

FIGS. 2A to 2E illustrate examples of a method for manufacturing a printed circuit board.

Figure 2A:
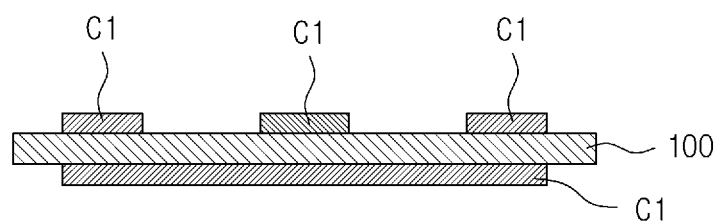
FIGS. 2A to 2E illustrate examples of a method for manufacturing a printed circuit board.

Referring to FIG. 2A, first circuits C1 are formed on a flexible insulating layer 100. The first circuit C1 may be formed by a tenting process or a modified semi addictive process (mSAP).

Figure 2B:
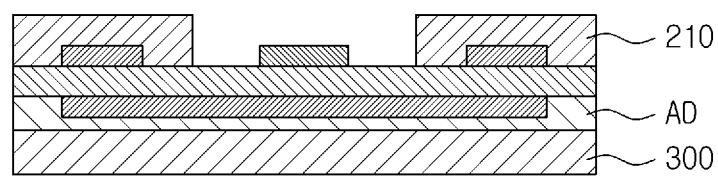

Referring to FIG. 2B, a coverlay 300 (lower coverlay) is bonded to a lower surface of the flexible insulating layer 100 with an adhesion layer AD interposed between the coverlay 300 and the flexible insulating layer 100. The coverlay 300 may be bonded to the flexible insulating layer 100 by a vacuum press lamination.

Figure 2C:
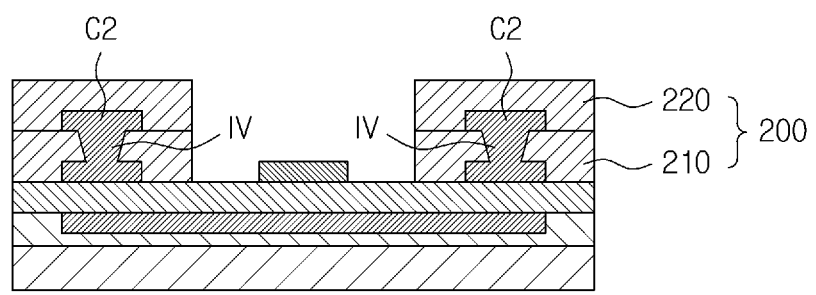

Referring to FIG. 2C, a rigid insulating layer 200 is laminated on a portion of a region of the flexible insulating layer 100, and rigid portions R1 and R2 are determined depending on a region where the rigid insulating layer 200 is laminated. In an example, the rigid insulating layer 200 may be formed by sequentially laminating a plurality of layers. Here, second circuits C2 and inner vias are formed. The second circuit C2 may be formed by a tenting process or a modified semi-addictive process (mSAP).

Figure 2D:
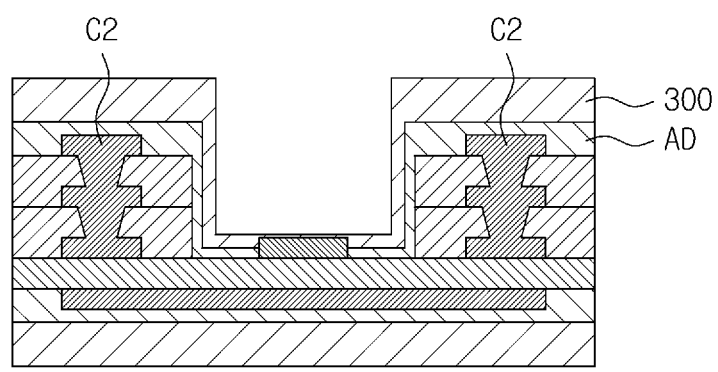

Referring to FIG. 2D, after all the second circuits C2 are formed, in particular, after the outermost second circuit is formed, a coverlay 300 (upper coverlay) is bonded to an upper surface of the rigid insulating layer 200 and an upper surface of the flexible insulating layer 100 with the adhesion layer AD interposed between the coverlay 300 and the flexible insulating layer 100 and the rigid insulating layer 200. In an example, the process in FIG. 2B is first described, but the order of the processes may be changed if necessary. The process in FIG. 2B may be performed after the process in FIG. 2D.

Figure 2E:
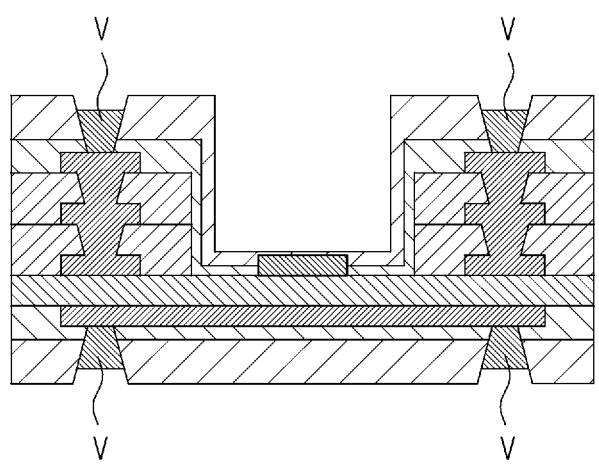

Referring to FIG. 2E, a via hole may be formed in the adhesion layer AD, and the coverlay 300 by a laser machining or the like, and the via hole may be filled with conductive material by plating or the like, thereby forming an outer via.

Figure 3:
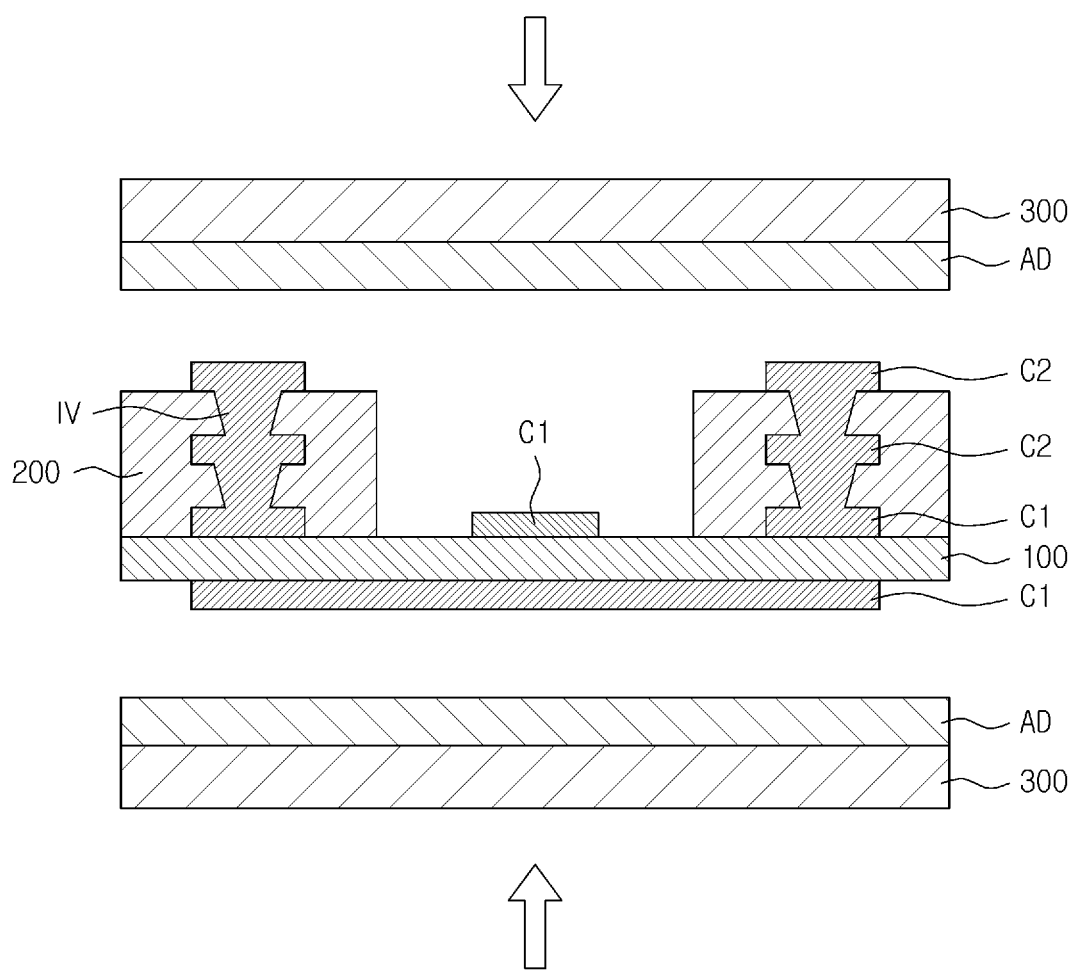
FIG. 3 illustrates an example method for manufacturing a printed circuit board.

FIG. 3 illustrates an example of a method for manufacturing a printed circuit board.

Referring to FIG. 3, a laminate is first prepared, and then coverlays 300 are bonded to the laminate. Here, unlike the case of FIGS. 2A to 2E in which the upper and lower coverlays 300 are sequentially bonded, upper and lower coverlays 300 are bonded at once. In this example, the upper and lower coverlays 300 are disposed on both surfaces of the laminate with adhesion layers AD, respectively, and the upper and lower coverlays 300 may be bonded to both surfaces of the laminate, respectively, by performing a vacuum press lamination.

Figure 4:
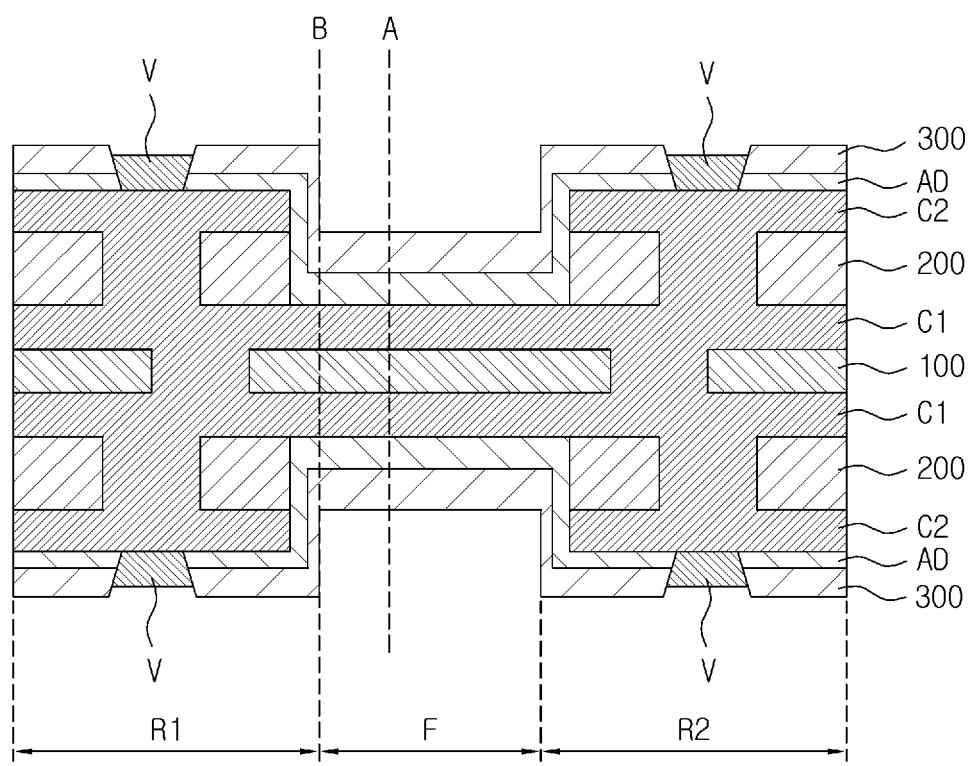
FIGS. 4 to 5C illustrate examples of a printed circuit board.
Figure 5A:
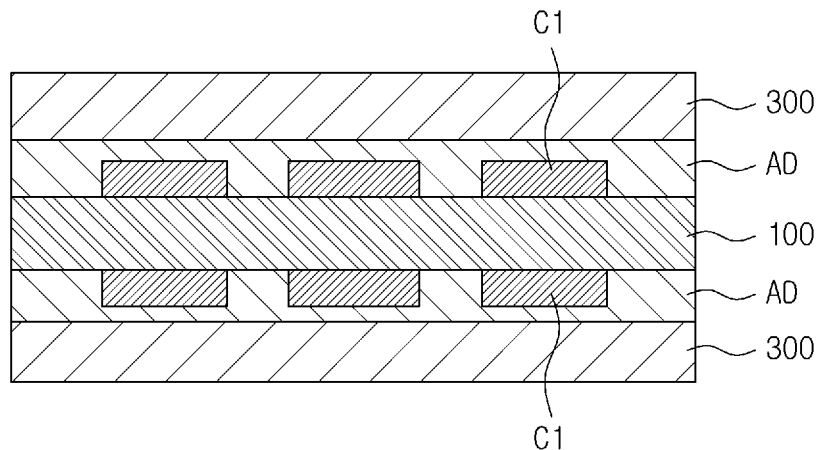
Figure 5B:
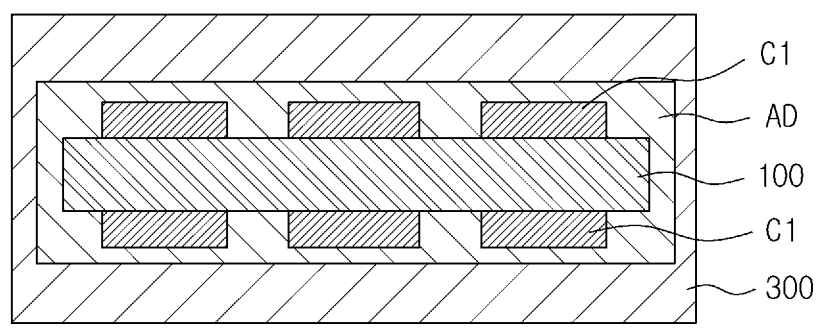
Figure 5C:
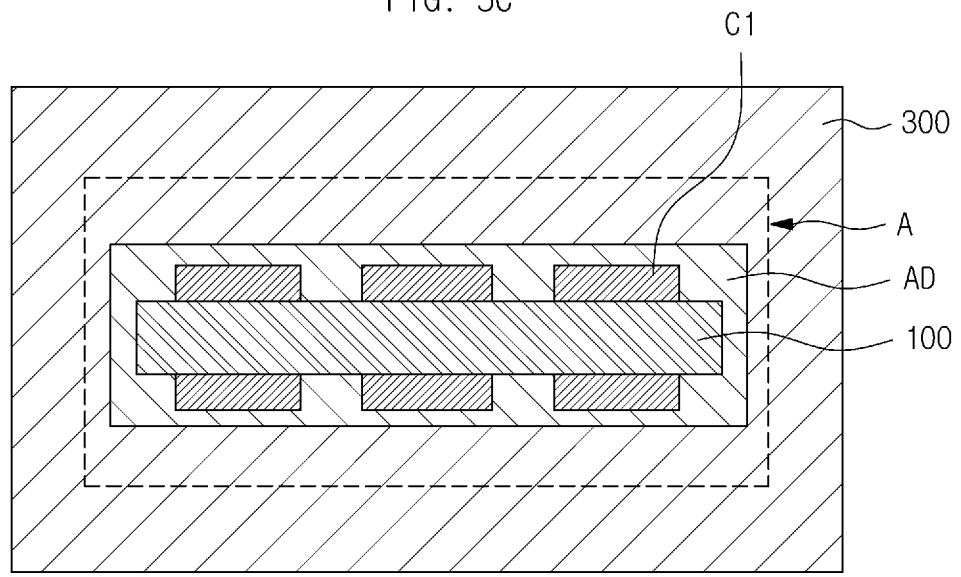

FIGS. 4 to 5C illustrate examples of a printed circuit board.

Referring to FIG. 4, the printed circuit board may have a symmetrical structure, unlike the asymmetrical printed circuit board of FIG. 1.

The printed circuit board may include a flexible insulating layer 100, rigid insulating layers 200, coverlays 300, and adhesion layers AD. The rigid insulating layers 200 are laminated on both surfaces of the flexible insulating layer 100, respectively. The coverlay 300 is bonded to an upper surface of the rigid insulating layer 200, an upper surface of the flexible insulating layer 100, and a side surface of the rigid insulating layer 200 positioned between the upper surface of the rigid insulating layer 200 and the upper surface of the flexible insulating layer 100. In addition, the coverlay 300 is bonded to a lower surface of the rigid insulating layer 200, a lower surface of the flexible insulating layer 100, and a side surface of the rigid insulating layer 200 positioned between the lower surface of the rigid insulating layer 200 and the lower surface of the flexible insulating layer 100.

Other components are the same as those described with reference to FIG. 1, and therefore, the description thereof will be omitted.

FIGS. 5A and 5B are examples of cross-sectional views taken along line A in a flexible portion F of FIG. 4.

Referring to FIG. 5A, an adhesion layer AD and a coverlay 300 cover first circuits C1 formed on a flexible insulating layer 100. The adhesion layer AD and the coverlay 300 may not cover a side surface of the flexible insulating layer 100.

Referring to FIG. 5B, unlike FIG. 5A, the adhesion layer AD and the coverlay 300 may cover the side surface of the flexible insulating layer 100.

In addition, FIG. 5C is an example of a cross-sectional view taken along line B in the flexible portion F of FIG. 4. Referring to FIG. 5C, the adhesion layer AD and the coverlay 300 may cover the entire region of a side surface of a rigid insulating layer 200 positioned between an upper surface of the rigid insulating layer 200 and an upper surface of the flexible insulating layer 100. In addition, the adhesion layer AD and the coverlay 300 may cover the entire region of a side surface of the rigid insulating layer 200 positioned between a lower surface of the rigid insulating layer 200 and a lower surface of the flexible insulating layer 100. Here, although a side surface of the second circuit C2 is exposed to the side surface of the rigid insulating layer 200, the second circuit C2 is covered by the adhesion layer AD and the coverlay 300. In addition, the adhesion layer AD and the coverlay 300 may cover the entire surfaces of rigid portions R1 and R2. In an example, the region by indicated by the dotted line in FIG. 5C is the cross-section taken along line A in FIG. 4 and the region of FIG. 5B.

Figure 6:
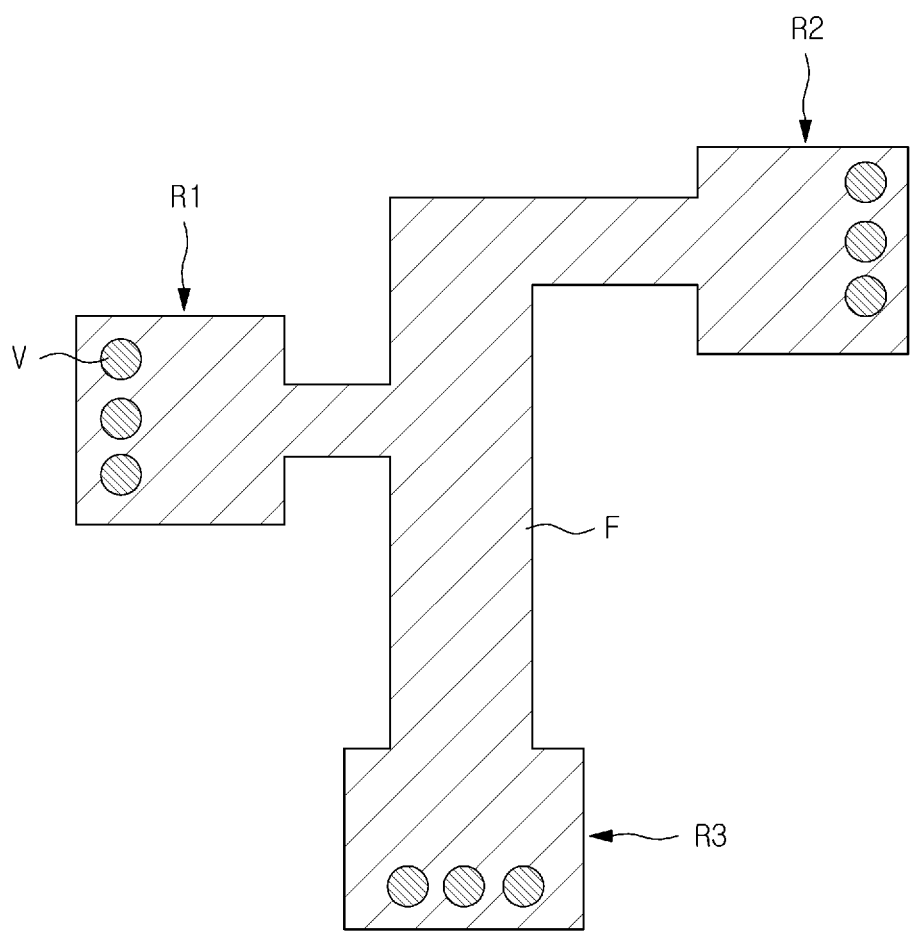
FIG. 6 illustrates an example of a printed circuit board.

FIG. 6 illustrates an example of a printed circuit board.

The printed circuit board in this example includes three rigid portions R1, R2, and R3, and one flexible portion F. All surfaces of the rigid portions R1, R2, and R3, and the flexible portion F are covered by a coverlay 300 and upper surfaces of vias of the rigid portions R1, R2, and R3 may be exposed. The exposed upper surface of the via may be bonded to an external element or an external board. In the present example, a width of each of the rigid portions R1, R2, and R3 may be greater than that of the flexible portion F, and a length of each of the rigid portions R1, R2, and R3 may be shorter than that of the flexible portion F.

In the present example, since the number of rigid portions is merely different from that in the examples described above, the same description as those described in the examples may be applied.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
   a flexible insulating layer;
   a rigid insulating layer disposed directly on a first portion of an upper surface of the flexible insulating layer; and
   a coverlay comprising a first portion disposed on an upper surface of the rigid insulating layer, a second portion disposed on a second portion of the upper surface of the flexible insulating layer connected to and different from the first portion, and a third portion disposed on a side surface of the rigid insulating layer positioned between the upper surface of the rigid insulating layer and the upper surface of the flexible insulating layer, and
   wherein the first portion of the coverlay and the second portion of the coverlay form a step connected by the third portion of the coverlay.

2. The printed circuit board of claim 1, wherein the first portion of the coverlay is adhered to the upper surface of the rigid insulating layer, the second portion of the coverlay is adhered to the second portion of the upper surface of the flexible insulating layer, and the third portion of the coverlay is adhered to the side surface of the rigid insulating layer by an adhesion layer.

3. The printed circuit board of claim 2, wherein the adhesion layer is bonded to the upper surface of the rigid insulating layer, the second portion of the upper surface of the flexible insulating layer, and the side surface of the rigid insulating layer positioned between the upper surface of the rigid insulating layer and the upper surface of the flexible insulating layer.

4. The printed circuit board of claim 1, wherein the coverlay is formed of any one or any combination of any two or more of polyimide (PI), a liquid-crystal polymer (LCP), or Teflon.

5. The printed circuit board of claim 2, wherein a thickness of the adhesion layer is smaller than a thickness of the coverlay.

6. The printed circuit board of claim 2, further comprising:
   a first circuit formed on the upper surface of the flexible insulating layer and covered by the coverlay; and
   a second circuit formed on the rigid insulating layer and covered by the coverlay.

7. The printed circuit board of claim 6, wherein a side surface of the second circuit is exposed to a side surface of the rigid insulating layer and covered by the coverlay.

8. The printed circuit board of claim 6, further comprising:
   a via penetrating through the coverlay and the adhesion layer and electrically connecting to the second circuit.

9. The printed circuit board of claim 1, wherein the rigid insulating layer is formed of a plurality of layers, and the coverlay is bonded to an uppermost layer of the plurality of layers.

10. A method of manufacturing a printed circuit board, comprising:
    forming a flexible insulating layer;
    forming a rigid insulating layer on a first portion of an upper surface of the flexible insulating layer; and
    disposing a coverlay comprising a first portion disposed on an upper surface of the rigid insulating layer, a second portion disposed on a second portion of the upper surface of the flexible insulating layer connected to and different from the first portion, and a third portion disposed on a side surface of the rigid insulating layer positioned between the upper surface of the rigid insulating layer and the upper surface of the flexible insulating layer,
    wherein the first portion of the upper surface of the flexible insulating layer is formed in direct contact with the rigid insulating layer, and
    wherein the first portion of the coverlay and the second portion of the coverlay form a step connected by the third portion of the coverlay.

11. The method of claim 10, wherein the first portion of the coverlay is adhered to the upper surface of the rigid insulating layer, the second portion of the coverlay is adhered to the second portion of the upper surface of the flexible insulating layer, and the third portion of the coverlay is adhered to the side surface of the rigid insulating layer by an adhesion layer.

12. The method of claim 11, wherein the coverlay is formed of any one or any combination of any two or more of polyimide (PI), a liquid-crystal polymer (LCP), or Teflon.

13. The method of claim 12, wherein a thickness of the adhesion layer is formed smaller than a thickness of the coverlay.

14. The method of claim 11, further comprising:
    forming a first circuit on the upper surface of the flexible insulating layer;
    disposing the coverlay on the formed first circuit; and
    forming a second circuit on the rigid insulating layer and disposing the coverlay on the formed second circuit.

\* \* \* \* \*